United States Patent [19]

McKeever et al.

[11] Patent Number: 5,288,589
[45] Date of Patent: Feb. 22, 1994

[54] AQUEOUS PROCESSABLE, MULTILAYER, PHOTOIMAGEABLE PERMANENT COATINGS FOR PRINTED CIRCUITS

[76] Inventors: Mark R. McKeever, 135 Center St.; Karuppiah Chandrasekaran, 206 Sharon Ave., both of Sayre, Pa. 18840

[21] Appl. No.: 984,795

[22] Filed: Dec. 3, 1992

[51] Int. Cl.$^5$ .............................................. G03C 1/805
[52] U.S. Cl. ................... 430/262; 430/260; 430/261; 430/281; 430/288; 430/312; 430/502
[58] Field of Search ............... 430/260, 261, 262, 281, 430/288, 312, 502

[56] References Cited

U.S. PATENT DOCUMENTS

| | | | |
|---|---|---|---|
| 4,293,635 | 10/1981 | Flint et al. | 430/271 |
| 4,349,620 | 9/1982 | Cyr et al. | 430/259 |
| 4,352,870 | 10/1982 | Howard et al. | 430/271 |
| 4,353,978 | 10/1982 | Leberzammer et al. | 430/260 |
| 4,485,167 | 11/1984 | Briney et al. | 430/281 |
| 4,698,294 | 10/1987 | Lau et al. | 430/325 |

*Primary Examiner*—Hoa Van Le

[57] ABSTRACT

The use of a two layer photoimageable, aqueous processable, resist with an amphoteric binder in the layer laminated directly to a printed circuit board provides a permanent coating with improved adhesion throughout the lamination process while maintaining other desirable properties such as storage stability and circuit encapsulation.

16 Claims, No Drawings

AQUEOUS PROCESSABLE, MULTILAYER, PHOTOIMAGEABLE PERMANENT COATINGS FOR PRINTED CIRCUITS

FIELD OF THE INVENTION

The present invention is directed towards aqueous processable, photoimageable elements for use as permanent coatings, such as for the protection of printed circuitry, that are comprised of two or more layers to obtain excellent support film release, comformability and substrate adhesion properties in a single element. It is also directed towards a process for application of such elements in combination with a liquid to provide a cost effective permanent coating with an acceptable balance of properties.

BACKGROUND OF THE INVENTION

Photopolymerizable resist materials are known to form a resist layer on a substrate, such as a printed circuit board, to allow subsequent processing of the substrate such as selective etching, electroplating or treatment with solder. The use of a non-photopolymerizable secondary layer in combination with photosensitive materials, such as a photopolymerizable resist, is known to enhance particular properties of the photoresist such as surface hardness, phototool release and photosensitivity.

The use of a solvent developable multiple layer photoresist for use in the etching of printed circuit detail is known. U.S. Pat. No. 4,349,620 describes such a photoresist that has improved adhesion, without sacrifice in development time, and with reduced film thickness. The use of a two layer photoresist system is disclosed in U.S. Pat. No. 4,352,870. Improved resolution is achieved through the resist layer closer to the substrate having a greater photosensitivity.

Lamination of a photosensitive material onto a substrate employing an intermediate liquid layer is taught in several U.S. Pat. Nos. using various liquids and application techniques. U.S. Pat. No. 3,629,036 discloses application of a liquid adhering agent, preferably a solvent for a resist containing a small amount of dissolved resist, to a surface of a substrate followed by application of a photosensitive resist film. U.S. Pat. No. 4,069,076 discloses a process for applying a photoresist film to a preimaged pattern relief substrate after flooding the substrate with a solvent or a nonsolvent swelling agent to reduce air entrapment and improve resist conformation. U.S. Pat. No. 4,293,635 discloses application of a photosensitive composition containing an amphoteric interpolymer, for improved cold flow, to a copper surface wetted with a liquid such as ethanol-water solution. U.S. Pat. No. 4,698,294 discloses a process for lamination of a dry film with a lamination liquid, which is substantially all monomer and non-photosensitive, such that adequate conformation and adhesion of the dry film to the circuit board is obtained with no air entrapment.

U.S. Pat. No. 4,506,004 discloses various embodiments of obtaining printed circuit boards more cost effectively by means of a two layer composite coating. In one embodiment an adhesive photopolymer layer is applied to a printed wiring board in a liquid state displacing air from the printed wiring board surface. A dry film solder mask is temporarily adhered to the underside of a screen printing frame and applied onto the liquid layer prior to processing of the photopolymer layer. In another of the embodiments of the patent nonphotoimaging epoxy layers can be employed.

In the use of permanent coatings for printed circuit boards, a combination of storage stability and acceptable end-use properties such as high temperature (solder) resistance, chemical inertness, high electrical resistance, low electromigration and good adhesion to raised copper metal reliefs is difficult to achieve, particularly with the use of liquids alone or dry films alone. Photoimageable liquid permanent coatings are known to suffer from pin-holes and skips as well as insufficient mask thickness at the corner of raised copper metal reliefs. Dry film photoimageable permanent coatings will typically alleviate the drawbacks of liquids, but are more costly and do not conform as well to the raised copper reliefs as liquids. It would be useful to have a permanent coating with an acceptable balance of the required storage, application and performance properties and particularly useful for the coating to be aqueous processable.

SUMMARY OF INVENTION

The present invention is directed towards an aqueous processable, storage stable, photoimagable permanent coating element having an acceptable balance of application and performance properties which comprises:

(a) a temporary support film;

(b) a first layer of a photoimagable permanent coating composition comprising:

(I) an amphoteric binder;
(II) a carboxyl containing copolymeric binder;
(III) a monomer; and
(IV) a photoinitiator or photoinitiator system; and (c) a second layer of a photoimagable permanent coating composition comprising;

(I) a carboxyl containing copolymeric binder,
(II) a monomeric component containing at least two ethylenically unsaturated groups,
(III) a photoinitiator or photoinitiator system, and
(IV) a thermal crosslinking agent, wherein the first layer is interposed between the support and the second layer, and wherein the level of carboxyl groups in the copolymeric binder is determined for a given composition by optimizing the amount needed for good development in aqueous alkaline developer, the binder having the structural unit:

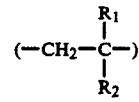

in which:

$R_1$ is H or alkyl;

$R_2$ is phenyl, $CO_2R_3$ or a macromer component; and $R_3$ is H or alkyl, which is unsubstituted or substituted with one or more hydroxy groups.

A second embodiment is directed towards a process for laminating the above element to a substrate wherein a liquid is applied to the substrate prior to element lamination, the first layer of the element being capable of allowing migration of the liquid into the permanent coating, the liquid subsequently becoming part of the cured permanent coating.

DETAILED DESCRIPTION OF THE INVENTION

The object of the invention is to provide a photoimagable permanent coating that can be stored for a useful length of time and that can be laminated to a printed circuit substrate by conventional means with adhesion such that no resist lifting occurs. A further object is to encapsulate raised relief without air entrapment and to be capable of developing in aqueous 0.85% sodium carbonate solution at 40° C. in about two minutes. The coating is to possess acceptable bulk properties, such as resistance to no-clean solder fluxes, resistance to multiple 500° F. solder exposures for 2-6 seconds, and thermal cycle resistance according to Mil Spec P55110D Thermal Shock 3.9.3 and 4.8.6.3. The coating is to also have acceptable properties at the substrate/coating interface, such as adhesion upon lamination and throughout processing such that no resist lifting occurs, as well as low electromigration per the Institute for Printed Circuits (IPC) Solder Mask 840B Electromigration Test 2.6.14.

This invention provides an overall balance of desireable properties through the utilization of at least two layers of storage stable photoimageable permanent coatings. The layer of photoimageable coating in contact with the printed circuit substrate, or first layer, contains at least 5 parts by weight of an amphoteric binder which provides a significant increase in adhesion upon lamination to the circuit board and through subsequent processing. In a preferred application mode, a variety laminating liquids can be used that, due to the presence of the requisite amount of amphoteric binder, are capable of migrating into the amphoteric binder containing layer upon lamination and becoming part of the cured permanent coating. The resusltant adhesion levels are sufficiently high to pass all the Lamination Quality Tests described below. The remaining ingredients of the first layer composition is without consideration for withstanding molten solder. The composition of the second and subsequent layers is more conventionally formulated for solder resistance and the bulk properties discussed above. The second layer may contain up to 4 parts by weight of an amphoteric bonder; a higher level generally results in incompatibility with typical ranges of conventional solder mask ingredients. The combination of first and second layers is more effective than a single layer of the same total thickness and entire composition of these multiple layers.

The layer of first photoimageable permanent coating, or simply the first layer, may be adjacent to a support film or a cover film. It is preferred that the first layer be applied by conventional means to the temporary support film from a solution and then dried. The layer of the second photoimageable permanent coating composition, or simply the second layer, may be applied as a solution or a preformed layer to the exposed surface of the first layer by conventional means to obtain high adhesion between these layers. Preferably, a cover film is laminated to the bare surface of the second layer so that the first and second photoimageable permanent coating layers are sandwiched between and protected by the support film and cover film. The photoimageable permanent coating element is storage stable. For purposes of this invention, storage stable is defined as the permanent coating element having the functional properties described above for 24 months when stored at about 20° C. and 50% relative humidity.

The permanent coating can be applied to the circuit board by first removal of the cover film, as conventionally done, and lamination of the exposed second layer to the circuit board through the support film. The support film typically has lower elongation, is stiffer and has a higher glass transition temperature that the cover film to provide support for the permanent coating during the drying step of manufacture. This can result in insufficient circuit encapsulation because the support film does not conform sufficiently well to the the circuit traces on the board surface. It is preferable to first remove the support film and laminate the exposed first layer surface to the circuit board through the cover film. Cover films generally have more elongation, lower glass transition temperature and are less stiff than support films. The preferred mode provides better circuit encapsulation of circuit traces on the printed circuit board.

The first layer preferably has a lower adhesion to the temporary support film than does the second layer have to the cover film. Generally, adhesion of the first layer to the temporary support film should be between about 1 to 25 grams per linear inch, preferably between about 3 to 10 grams per linear inch, and the adhesion of the second layer to the cover film should be between about 10 to 1000 grams per linear inch, preferably between about 20 to 300 grams per linear inch. Upon removal of the support film, the uncovered (bare) surface of the first layer can be laminated through the cover film to encapsulate the substrate surface and the entire permanent coating processed to form a resist image on the surface. The first layer in contact with the substrate surface of a substance, usually copper and dielectric material, has high adhesion to the surface as well as to the second layer, such that the cover film can be removed from the second layer without delamination between the layers or between the first layer and the substrate.

and second layers have a similar photospeed and are developable with about the same concentration of aqueous alkaline solution, such as 0.85% sodium carbonate within two minutes, so that the complete thickness of the first and second layers can be washed away in a single development step to leave a resist image of both layers on the substrate surface.

The thickness of the combination of photoimageable layers will depend on any relief pattern on the substrate surface. Generally, the total thickness will be no greater than 125 microns (5 mils). When the permanent coating element is used in combination with a photosensitive laminating liquid, the total thickness will generally be no greater than 50 microns (2 mils), and preferably, no greater than 37.5 microns (1.5 mils). Normally, the first layer will comprise 0.5 to 50% of the combined layer thicknesses and preferably 4 to 30%.

Temporary Support

Any of the support films known for use as such for a photoresist film can be used in the present invention. The temporary support film, which preferably has a high degree of dimensional stability to temperature changes, may be chosen from a wide variety of polyamides, polyolefins, polyesters, vinyl polymers, and cellulose esters, and may have a thickness of from about 6 to 200 microns. A particularly suitable support film is polyethylene terephthalate having a thickness of about 25 microns. The temporary support film can be treated to improve release properties with substances such as silicone.

Permanent coating compositions

Of the first layer of photoimagable permanent coating components the preferred ranges are 5 to 25 parts by weight of amphoteric binder; 30 to 80 parts by weight of copolymeric binder containing carboxyl functionality; 5 to 30 parts by weight of monomer; 0.5 to 10 parts by weight of a photoinitiator or photoinitiator system; 0 to 15 parts by weight of thermal crosslinking agent; and 0 to 30 parts by weight of inorganic filler.

Of the second layer of photoimagable permanent coating components the preferred ranges are 30 to 80 parts by weight of copolymeric binder containing carboxyl functionality; 20 to 50 parts by weight monomer; 0.5 to 10 parts by weight photoinitiator or photoinitiator system; 5 to 25 parts by weight of thermal crosslinking agent; and 0 to 30 parts be weight inorganic filler.

Binder Material Amphoteric Binder

The first photoimagable permanent coating layer contains as an essential ingredient an amphoteric binder at 5 to 25 parts by weight of the layer composition. The second photoimageable permanent coating layer may contain 0-4 parts by weight of an amphoteric binder.

The amphoteric polymers which are necessary components of the first layer of the photoimagable compositions of the invention are interpolymers derived from the interpolymerization of (1) at least one basic comonomer which is an acrylic or methacrylic acrylamide or methacrylamide, an aminoalkyl acrylate or methacrylate or mixture of any of these; (2) at least one acidic comonomer containing one or more carboxyl groups and (3) at least one further comonomer which is acrylic or methacrylic in character.

The applicable N-substituted acrylamides or methacrylamides are substituted with alkyl radicals containing from 2-12 carbon atoms. Among the applicable acrylamides and methacrylamides are included N-ethyl acrylamide, N-tertiary-butyl acrylamide, N-n-octyl acrylamide, N-tertiary-octyl acrylamide, N-decyl acrylamide, N-dodecyl acrylamide, as well as the corresponding methacrylamides. Suitable aminoalkyl compounds are the $(C_{1-4})$ alkyl $(C_{2-4})$ aminoalkyl acrylates and methacrylates.

Suitable acidic comonomers for the amphoteric polymers used in the invention are those having at least one available carboxylic acid group. These include acrylic acid, methacrylic acid, crotonic acid, itaconic acid, maleic acid, fumaric acid and the $C_1-C_4$ alkyl half esters of maleic and fumaric acids, such as methyl hydrogen maleate and butyl hydrogen fumarate as well as any other acidic monomers which are capable of being copolymerized with the particular interpolymer system whose use is desired by the practitioner. As is known to those skilled in the art, the acidic comonomer(s) must be so chosen as to be readily polymerizable with the selected interpolymer system.

In order to modify or enhance certain properties of the amphoteric polymer, such as adhesion, compatibility, water solubility, hardness, flexibility, antistatic properties and the like, any of the following acrylic and methacrylic comonomers can be used: acrylic and methacrylic acid esters of aliphatic alcohols having from 1 to 12 carbon atoms such as methyl, ethyl, propyl, butyl, octyl and lauryl alcohols; hydroxyalkyl esters of acrylic and methacrylic acids such as hydroxypropyl acrylate and methacrylate, hydroxybutyl acrylate and methacrylate, hydroxystearyl acrylate and methacrylate, hydroxystearyl acrylate and methacrylate and hydroxyethyl acrylate and methacrylate; alkyl $(C_1-C_4)$ amino alkyl $(C_2-C_4)$ esters of acrylic and methacrylic acids such as N, N'-diethylaminoethyl acrylate, N-tert.-butylaminopropyl acrylate, N ,N'-dimethylaminoethyl methacrylate, N-tert.-butylaminoethyl methacrylate and the quaternization product of dimethylaminoethyl methacrylate and dimethyl sulfate, diethyl sulfate and the like; diacetone acrylamide; vinyl esters such as vinyl acetate and vinyl propionate; and styrene monomers such as styrene and alpha-methyl styrene.

Preferred amphoteric interpolymers are those containing from about 30-60 parts by weight of the N-substituted acrylamide or methacrylamide, from 10-20 parts by weight, (and 12-18 parts, preferably) of the acidic comonomer, and up to 55 parts by weight of at least one copolymerizable comonomer; these percentages being based on the total weight of the interpolymer. The parts by weight given herein and in the claims are to be taken so that the comonomers of the interpolymer will total to 100 parts.

Particularly preferred because they combined the best combination of physical properties for the invention are those polymers containing from 35-45 parts by weight of N-tert.-octyl acrylamide, from 12-18 parts by weight of acrylic or methacrylic acid, from 32-38% of methyl methacrylate, from 2-10 parts by weight of hydroxypropyl acrylate, and from 2-10 parts by weight of an alkyl $(C_1-C_4)$ amino alkyl $(C_2-C_4)$ acrylate or methacrylate.

Preparation of the above-described acrylic interpolymers is described in U.S. Pat. No. 3,927,199 to Micchelli et al.

Copolymer Binder

The copolymer binder component essential to the invention is a carboxyl containing copolymer made from the structural unit:

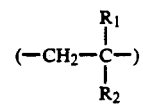

in which $R_1$ is H or alkyl; $R_2$ is phenyl, $CO_2R_3$ or macromer; and $R_3$ is H or alkyl, which is unsubstituted or substituted with one or more hydroxy groups. Suitable comonomers, which form the structural unit A of the copolymer essential to the invention, are styrene and unsaturated carboxylic acids and their derivatives, such as (meth)acrylic acid and (meth)acrylates. Methyl methacrylate, methyl acrylate, ethyl acrylate, butyl acrylate, ethyl methacrylate, butylmethacrylate 2-hydroxyethyl acrylate and hydroxyethyl methacrylate are preferred derivatives. A macromer can be, and preferentially is, incorporated into the copolymer binder, to form a branch polymer segment, during the addition polymerization process of a macromer and a comonomer. The macromer can be present as 0 to 80 parts by weight based on the total weight of the monomers used in the polymerization process. It is preferable that the copolymer binder contain 5 to 50 parts by weight macromer. These copolymer binders can be prepared by any of the addition polymerization techniques known to those skilled in the art, such as described in U.S. Pat.

No. 4,273,857. A "macromer" for the purpose of this invention, is a polymer, copolymer or oligomer of molecular weight ranging from several hundred to about 40,000 containing a terminal ethylenically unsaturated polymerizable group. The branched polymer segments or macromers can be any of those derived from ethylenically unsaturated macromers prepared according to the general descriptions in U.S. Pat. Nos. 4,680,352; 4,694,054 and 4,722,984. Illustrative macromers are vinyl polymers, acrylic polymers and copolymers of acrylic monomers and vinyl monomers. Preferred monomer components for use in preparing macromers include: methyl methacrylate, ethyl (meth)acrylate, butyl (meth)acrylate, 2-hydroxyethyl (meth)acrylate, methacrylic acid, acrylic acid and styrene.

Macromers useful in this invention have limited molecular weight and polydispersity. Polydispersity is employed in its conventional sense as the ratio of the weight average molecular weight ($M_W$) to the number average molecular weight ($M_n$), i.e. $M_W/M_n$. Preferably the macromer will have a weight average molecular weight of about several hundred to 40,000 and a $M_W/M_n$ of about 5 or less. Particularly preferred are macromers having a $M_W$ of about 5,000 or less and a $M_W/M_n$ of 3 or less.

The copolymer binder of the invention can be formed by direct copolymerization of one or more ethylenically unsaturated dicarboxylic acid anhydrides with one or more the comonomers described above. Suitable ethylenically unsaturated dicarboxylic acid anhydrides are, for example, maleic anhydride, itaconic acid anhydride and citraconic acid anhydride. The copolymer binder containing acid anhydride functionality can be reacted with primary aliphatic or aromatic, optionally substituted, amines. Substituents can be the following functional groups: secondary amino, tertiary amino, hydroxy, ester, keto, ether and/or thioether groups. Propyl amine, butyl amine, aminopropanol, aminoethanol, 2-aminophenol, decyl amine, N-methyl-1,2-diaminoethane, N-ethyl-1,2-diaminoethane, N,N-dimethyl-1,2-diaminoethane, N-(2-hydroxyethyl)-1,2-diaminoethane and cyclohexyl amine are preferred.

When the permanent coating is photoprinted, development of the composition requires that the binder material should contain sufficient carboxylic acid groups to render the permanent coating processable in aqueous alkaline developer. The coating layer formed from the element will be removed in portions which are not exposed to radiation but will be substantially unaffected in exposed portions during development by aqueous alkaline liquids such as wholly aqueous solutions containing 0.85% sodium carbonate by weight for a time period of two minutes at a temperature of 40° C. The acid number of the copolymer binder for the first photopolymerizable permanent coating layer should be 40 to 160, preferably 60 to 150, to also optimize adhesion to the printed circuit substrate. The acid number of the copolymer binder for the second photopolymerizable permanent coating layer should be 40 to 100, preferably 50 to 90.

In order to have sufficient conformability and resistance to drastic changes in environmental conditions, the permanent coating requires that the binder material have a glass transition temperature less than 90° C. The binder material for the first photopolymerizable permanent coating layer should have a glass transition temperature preferably from 30° C. to 80° C. If the Tg of the binder material is less than 30° C., adherence to the support film can be too high for desired release.

The proper molecular weight range is required for manufacturing purposes, such as solution viscosity and process latitude, as well as for a proper balance of permanent coating properties, such as toughness and solder resistance. A copolymer binder molecular weight range from about 25,000 to 500,000 is suitable. The preferred range is from about 40,000 to 250,000.

The quantity of total copolymer binder is generally 30 to 80 parts by weight relative to the total components of the permanent coating composition.

Monomer

The momomer provides the capability of the permanent coating composition to photopolymerize and contributes to overall properties. In order to effectively do so, the monomer should contain at least two ethylenically unsaturated groups capable of undergoing polymerization on exposure to actinic radiation when incorporated in the permanent coating element. Excessive amounts of trifunctional acrylate monomers can result in reduction of required flexibility. For purposes of this invention, it is desireable to have a relatively lower level of monomer concentration in the first permanent coating layer in order to insure that adhesion of the first layer to the support film is not excessive.

Suitable monomers which can be used as the sole monomer or in combination with others include acrylate and methacrylate derivatives of alcohols, isocyanates, esters, epoxides and the like. Examples are diethylene glycol diacrylate, trimethylolpropane triacrylate, pentaerythritol triacrylate, polyoxyethylated and polyoxypropylated trimethylolpropane triacrylate and trimethacrylate and similar compounds as disclosed in U.S. Pat. No. 3,380,831, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, triethylene glycol dimethacrylate, trimethylol propane triacrylate, polycaprolactone diacrylate, and aliphatic and aromatic urethane oligomeric di(meth)acrylates from Sartomer, West Chester, Pa.

A particularly preferred class of comonomers is hexamethylene glycol diacrylate, triethylene glycol diacrylate, tripropylene glycol diacrylate, trimethylolpropane triacrylate, polyoxyethylated trimethylolpropane triacrylate, polyoxypropylated trimetholpropane triacrylate, pentaerythritol tri- and tetracrylate, bisphenol A diacrylate, di-(3-acryloxy-2-hydroxypropyl) ether of bisphenol-A, di-(3-acryloxy-2-hydroxypropyl) ether of tetrabromo-bisphenol-A, or methacrylate analogues thereof as well as aliphatic urethane diacrylates CN 961 and CN 964, and aromatic urethane diacrylates CN 971 and CN 972 available from Sartomer, West Chester, Pa.

The quantity of total monomer is generally 5 to 30 parts by weight relative to the total components of the first photoimagable permanent coating layer, whereas the quantity of total monomer for the second photoimagable permanent coating layer is generally 20 to 50 parts by weight relative to the total components of the second layer.

Photoinitiator Systems

The photoinitiator system has one or more initiator compounds that directly furnish free-radicals when activated by actinic radiation. The system also may contain a sensitizer that is activated by the actinic radiation, causing the initiator compound to furnish the free-radicals. The sensitizer may extend spectral response into the near ultraviolet, visible, and near infrared spectral regions.

Numerous conventional photoinitiator systems are known to those skilled in the art and may be used provided they are compatible with the other ingredients of the coating composition. A large number of freeradical generating compounds, including redox systems such as Rose Bengal/2-dibutylaminothanol, may be selected to advantage. A useful discussion of dye sensitized photopolymerization can be found in "Dye Sensitized Photopolymerization" by D. F. Eaton in *Adv. in Photochemistry*, Vol. 13, D. H. Volman, G. S. Hammond, and K. Gollinick, eds., Wiley-Interscience, New York, 1986, pp. 427–487.

Sensitizers useful with photoinitiators include methylene blue and those disclosed in U.S. Pat. Nos. 3,554,753; 3,563,750; 3,563,751; 3,647,467; 3,652,275; 4,162,162; 4,268,667; 4,351,893; 4,454,218; 4,535,052; and 4,565,769. A preferred group of sensitizers include the bis(p-dialkylaminobenzylidene) ketones disclosed in Baum et.al., U.S. Pat. No. 3,652,275, and the arylidene aryl ketones disclosed in Dueber, U.S. Pat. No. 4,162,162.

Preferred photoinitiator systems are 2,4,5-triphenylimidazolyl dimers in combination with chain transfer agents, or hydrogen donors, such as are disclosed in U.S. Pat. Nos. 3,479,185; 3,784,557; 4,311,783; and 4,622,286. Preferred hexaarylbiimidazoles (HABI) are 2-ortho-chlorosubstituted hexaphenylbiimidazoles in which the other positions on the phenyl radicals are unsubstituted or substituted with chloro, methyl or methoxy. The most preferred initiator is ortho-Cl-HABI, i.e., 1,1'-biimidazole, 2,2'-bis(ortho-chlorophenyl)-4,4',5,5'-tetraphenyl-imidazole dimer.

Hydrogen donor compounds that function as chain transfer agents in the photopolymer compositions include:

2-mercaptobenzoxazole, 2-mercaptobenzothiazole, 4-methyl-4H-1,2,4-triazole-3-thiol, etc.; as well as various types of compounds, e.g., (a) ethers, (b) esters, (c) alcohols, (d) compounds containing allylic or benzylic hydrogen, (e) acetals, (f) aldehydes, and (g) amides disclosed in column 12, lines 18 to 58 of MacLachlan U.S. Pat. No. 3,390,996. Suitable hydrogen donor compounds for use in systems containing both biimidazole type initiator and N-vinyl carbazole are 5-chloro-2-mercaptobenzothiazole; 2-mercaptobenzothiazole; 1H-1,2,4-triazole-3-thiol; 6-ethoxy-2-mercaptobenzothiazole; 4-methyl-4H-1,2,4-triazole-3-thiol; 1-dodecanethiol; and mixtures thereof.

A particularly preferred class of photoinitiators and photosensitizers are benzophenone, Michler's ketone, ethyl Michler's ketone, p-dialkylaminobenzaldehydes, p-dialkylaminobenzoate alkyl esters, polynuclear quinones, thioxanthones, hexaarylbiimidazoles, cyclohexadienones, benzoin, benzoin dialkyl ethers, or combinations thereof where alkyl contains 1 to 4 carbon atoms.

For purposes of this invention, it is preferred to utilize a photoinitiator system in the first photoimageable permanent coating layer that has an absorbance maximum at about the absorbance minimum for the second photoimageable layer. In this manner, sufficient incident exposure radiation will be able to pass through the second layer to expose the first layer in a similar time period as for the second layer.

Thermal Crosslinking Material

When a photopolymerizable coating is to be used as a permanent resist, such as a solder mask, a chemically or thermally activated crosslinking agent may be incorporated to improve mechanical or chemical properties. Suitable crosslinking agents useful in the present invention are those in the prior art and include those disclosed in Iimure, U.S. Pat. No. 4,961,960 as well as those disclosed in Gervay, U.S. Pat. No. 4,621,043 and Geissler et al., U.S. Pat. No. 4,438,189, such as an adduct of a polyisocyanate compound and an isocyanate group-blocking agent, and formaldehyde condensation resins with melamines, ureas, benzoguanamines and the like.

The thermally activated crosslinking agent crosslinks with reactive functionality, such as hydroxyl, carboxyl and amide groups, which are present in binders and other ingredients in the coating formulation. The presence of the proper crosslink imparts the capability to withstand molten solder temperature and improves chemical resistance or other mechanical or chemical properties required in the end-use product. For purposes of this invention, it is desireable to have a relatively higher level of crosslinker in the second permanent coating layer than in the first layer to provide the optimal balance of ability of the permanent coating to withstand substrate flex (a more resiliant first layer) and assure resistance to heat and chemicals (a harder second layer).

A preferred thermal crosslinking agent for the second photoimageable permanent coating layer is an adduct of a polyisocyanate and an isocyanate-group blocking agent. To assure a proper degree of cross-linking with the reactive functionality, the isocyanate must by definition contain at least two isocyanate functional groups. Preferably the polyisocyanate will contain from two to five, most preferably two or three isocyanate functional groups in the molecule.

Suitable polyisocyanates are those known in the art and include hexamethylene diisocyanate, the 1,3-, and 1,4-phenylene diisocyanates, the 2,4, and 2,6-toluene diisocyanates, the 1,3-, and 1,4-xylylene diisocyanates, bis(4-isocyanato-phenyl)methane, bis(4-isocyanatocyclohexyl)methane, isophorone diisocyanate, and similar polyisocyanates. The preferred polyisocyanate in the present invention is the cyclic trimer of hexamethylene-1,6-diisocyanate and derivatives thereof.

Various isocyanate group-blocking agents are known in the art and are suitable for reaction with the above isocyanate compounds to provide the thermal crosslinking agent used in this invention. These include secondary or tertiary alcolols such as isopropanol and tertiary butanol, lactams such as e-caprolactam, phenols, such as phenol, chlorophenol, cresol, p-tert.-butylphenol, p-sec.-butylphenol, p-sec.-amylphenol, p-octylphenol, and p-nonylphenol, heterocyclic hydroxyl compounds such as 3-hydroxypyridine, 8-hydroxyquinoline, 8-hydroxyquinaldine and the like. Active methylene compounds such as dialkyl malonate, acetylacetone and alkyl acetoacetate oximes such as acetoxime, methyl ethyl ketoxime and cyclohexanone oxime are preferred blocking agents for the polyisocyanates used in this invention.

The most preferred polyisocyanate for use in the present invention is the cyclic trimer of hexamethylene1,6-diisocyanate completely blocked with methyl ethyl ketoxime, available from Miles as Desmodur® BL3175A.

Aldehyde condensation products, or resin precursors, are also suitable thermal crosslinking agents for the practice of the present invention. Stability of an aldehyde condensation resin precursor in the presence of an acid binder is important for the shelf life stability of the composition. A binder having an acid number of at least 45 and a pKa value of at least 5, measured in 1:1 volume ratio of methanol to water, will not react in a short time period to form the crosslinkable aldehyde resin at a temperature significantly lower than 120° C.

Since a thermal cure is necessary for the reaction to proceed, extended storage time can be obtained for the photosensitive permanent coating element. In addition it is possible to laminate the film to a support at a temperature of 120° C. or lower without initiating the thermal cure reaction between the acid binder and the aldehyde condensation product.

Examples of suitable crosslinking compounds include: N- methylol compounds of organic amides such as: N,N'-dimethylolurea, N,N'-dimethylolmalonamide, N,N'-dimethylolsuccinimide, trimethylolmelamine, tetramethylolmelamine, hexamethylolmelamine, 1,3-N,N'dimethylolterephthalamide, and C-Methylol compounds of phenols, phenol-ethers and aromatic hydrocarbons such as 2,4,6- trimethylolphenol, 2,6-dimethylol-4-methyloanisole and 1,3-dimethylol-4,6-diisopropylbenzene.

Instead of the aforementioned methylol compounds, it is also possible to use, for example, the corresponding methyl, ethyl or butyl ethers, or esters of acetic acid or propionic acid. Preferred examples of methylol ethers are those from formaldehyde condensation products with melamines and ureas. Particularly preferred choices are hexamethoxymethyl-melamine and the butyl ether of the formaldehyde condensation product with melamine.

The quantity of thermal crosslinking agent is generally 0 to 15 parts by weight relative to the total components of the first photoimagable permanent coating layer, whereas the thermal crosslinking agent for the second photoimagable layer is generally 5 to 25 parts by weight relative to the total components of the second coating layer.

OPTIONAL MATERIALS OR ADDITIVES

In conventional photoresist elements it is necessary or at least highly desireable to protect the photosensitive layer by a removable cover film in order to prevent blocking when it is stored in roll form. It is also desireable to protect the photoresist laminated to the printed circuit substrate by means of the removable film during imaging exposure to prevent blocking between the layer and the phototool.

The protective cover film may be selected from the same group of high polymer films described for the temporary support film, supra, and may have the same wide range of thicknesses. However, it is preferable to use a cover film that is relatively flexible and capable of conforming easily under lamination conditions to the irregular copper metal relief of a printed circuit board. The conformability of the cover film enables good encapsulation of the circuits by the permanent coating. A cover film of 15-30 microns thick polyethylene or polypropylene is especially suitable. Preferably, at least one surface of the cover film has a matte surface. If exposure is to be made before removing the cover film, it must transmit a substantial fraction of the actinic radiation incident upon it.

Fillers

The permanent coating compositions may contain inorganic particulates to modify the mechanical or chemical properties required during its processing or end use. Suitable fillers include inorganic reinforcing agents which are essentially transparent as disclosed in U.S. Pat. No. 2,760,863, inorganic thixotropic materials as disclosed in U.S. Pat. No. 3,525,615, microcrystaline thickeners as disclosed in U.S. Pat. No. 3,754,920, finely divided powders having a particle size of 0.5 to 10 micrometers as disclosed in U.S. Pat. No. 3,891,441, and the binder-associated, transparent, inorganic particles as disclosed in European Patent Application 87113013.4. The inorganic filler can be surface treated, such as with amino-silane to enhance end-use properties. Typically, the filler will be transparent to actinic radiation to preclude adverse effects during imaging exposure. Depending on its function in the photopolymerizable composition, the filler may be colloidal or have a nominal particle size of 0.5 micrometers or more in diameter.

The inorganic filler may be present in the first, second or both photoimageable permanent coating layers at 0 to 30 parts by weight of the permanent coating layer composition.

Other Components

Other compounds conventionally added to photopolymer compositions may also be present in the permanent coating to modify the properties of the coating solution or physical properties of the film. Such components include: adhesion promotors, thermal stabilizers, colorants such as dyes and pigments, viscosity control agents, coating aids, wetting agents, release agents, elastomers and like materials known to those skilled in the art.

The permanent coating composition may contain a heterocyclic or mercaptan compound to improve adhesion of the coating to the metal circuit pattern during processing or in the end-use product. Suitable adhesion promotors include heterocyclics such as those disclosed in Hurley et al., U.S. Pat. No. 3,622,334, Jones, U.S. Pat. No. 3,645,772, and Weed, U.S. Pat. No. 4,710,262.

A particularly useful additive is polyvinyl pyrrolidone or copolymers, such as with vinyl acetate. These materials improve the coatability of coating solutions while improving storage stability of a dry film through an increase in creep viscosity, which corresponds to lower cold flow.

Examples of thermal polymerization inhibitors that can be used in the permanent coating compositions are: Irganox®1010, alkyl and aryl-substituted hydroquinones and quinones, tert.-butyl catechol and the nitroso compositions disclosed in U.S. Pat. No. 4,168,982 and substituted hydroxylamines disclosed in U.S. Pat. No. 4,298,678.

Various dyes and pigments may be added to increase the visibility of the resist image. Any colorant used, however, should preferably be transparent to the actinic radiation used.

Process Steps

The process of the invention is a secondary imaging process to make permanent coatings, i.e., a solder mask, to protect the printed circuit during subsequent processing, primarily solder operations, and/or from environmental effects during use. Permanent coatings also are used as intermediate insulative layers, with or without development, in the manufacture of multilayer printed circuits.

In practice, a photopolymerizable, permanent coating layer, generally between 10 and 125 micrometers (0.4 and 5 mils) thick, is applied to a printed circuit substrate which typically has a printed circuit relief pattern on a substrate that is semi-rigid, such as fiberglass reinforced epoxy, or on a flexible film substrate based on polyimide or polyester film. The applied photoimagable, permanent coating layer is then imagewise exposed to actinic radiation to harden or insolubilize exposed areas. Any unexposed areas are then completely removed typically with an alkaline, aqueous sodium or potassium carbonate developer solution which selectively dissolves, strips or otherwise disperses the unexposed areas without adversely affecting the integrity or adhesion of the exposed areas. The developed permanent resist image is treated to further cure or harden it by baking at elevated temperatures, such as one hour at 150° C., by additional uniform exposure to actinic radiation or a combination thereof to produce a circuit board having a cured permanent resist layer covering all areas except pad or throughhole areas. Electrical components are inserted into the through-holes or positioned on surface mount pads and soldered in place to form the packaged electrical assembly.

The photoimageable permanent coating may be applied to a printed circuit substrate either as a pre-formed dry film, or as a dry film in combination with a photosensitive liquid.

Dry Film Lamination

Typically, when a dry film is laminated to a printed circuit substrate having a circuit relief, measures must be taken to eliminate entraped air, e.g., from around circuit lines. Entraped air is eliminated by the conventional solder mask vacuum lamination process, which is an acceptable means of applying the preferred multilayer permanent coating element of this invention to a printed circuit substrate.

In place of a conventional vacuum laminator, a lamination system such as that disclosed in U.S. Pat. No. 4,698,294 is preferably employed. A lamination liquid is used to displace air during the lamination procedure.

However, criticality is present herein in interaction between the lamination liquid and photoimagable film in contact with the liquid, both of which are in contact with the substrate surface, to obtain the desired result. The lamination liquid is capable of migrating into the first layer upon lamination of the photoimageable element and becoming part of the cured permanent coating. Without being held to any theory, the composition of the first layer of the photoimageable permanent coating is such that the liquid will rapidly diffuse into and plasticize the first layer of the permanent coating, thus providing improved instant adhesion to the printed circuit substrate sufficient to withstand the sequence of lamination process steps. The lamination process in the preferred case consists of:

(1) applying to a substrate surface a liquid which is capable of migrating into the permanent coating and becoming part of the cured permanent coating, (2) removing the support film from the permanent coating element, (3) laminating the permanent coating dry film to the liquid wetted substrate by passing this combination through a nip of heated, pressurized, rubber rolls, (4) trimming the excess permanent coating film, and, if required, (5) rinsing the excess lamination liquid from the substrate and drying the substrate. The permanent coating dry film, in combination with the lamination liquid, must adhere to the substrate such that it is functional throughout the lamination process as well as for subsequent process steps and in the intended enduse. The dry film/lamination liquid combination of this invention has excellent adhesion throughout the entire lamination process.

With a planar or substantially planar substrate both low and high viscosity liquids can be employed although a high viscosity liquid will generally take more time to apply. Also, high viscosity liquids have a tendency to trap air which is undesirable. However, for substrates which have a raised relief, relatively low viscosity liquids are preferred particularly due to the need to remove air which can be entrapped. Generally the viscosity of the liquid in such a case will not be greater than 400 centipoise and more preferably not greater than 200 centipoise. A most preferred range of viscosity is from 5 to 50 centipoise. Typically the raised relief will be at least 18 microns (0.7 mils) with typical circuit heights ranging from 36 to 100 microns (1.4 to 4.0 mils) and higher.

The lamination liquid should preferably be a composition which is capable of forming a high polymer by photoinitiated polymerization of monomer and, in combination with the first photoimageable layer of the element of this invention, be capable of high adhesion such that the permanent coating will pass all the Lamination Quality Tests described below. The compound called monomer herein is nongaseous and ethylenically unsaturated containing at least one terminal ethylenic group with a boiling point above 100° C. at normal atmospheric pressure. A preferred class of monomers has at least two terminal ethylenic groups. It is not required that the liquid contain a photoinitiator or photoinitiator system, but it is preferred. Representative of these components would be those conventionally used in the photoimagable resist art. The liquid should be substantially free of polymeric materials such as binder, which is an essential component of photoimagable dry film. If a monomer ingredient of the lamination liquid has an unduly high viscosity, a combination of monomers can be used, e.g., high and low viscosity monomers. A suitable type and amount of a diluent conventionally used in the photoimageable resist art can also be used for effective viscosity control.

The photopolymerizable compounds which can be used in the lamination liquid are varied and can be selected from monomers formulated to be a portion of the photoimageable permanent coating composition. Preferred monomers are: tripropylene glycol diacrylate, tetraethylene glycol dimethacrylate, trimethylolpropane ethoxylated triacrylate, polyethoxylated phenol monoacrylate, ethoxylated bisphenol-A diacrylate, neopentyl glycol propoxylate diacrylate, trimethylolpropane triacrylate and polyamine acrylate (from Henkel Corporation, Ambler, PA). Combinations of monomers and solvents can be employed to optimize adhesion properties of the combined lamination liquid and photopolymerizable coatings to the printed circuit substrate.

Permanent Coating Testing Support Film and Cover Film Adhesion Test

The adhesion of the permanent coating to the support film and the cover film can be quantified by measurement according to this procedure.

1. Cut two strips one inch wide and at least six inches long with a one inch strip cutter. Samples should be cut in the machine direction of the support or cover film.
2. Samples for support film adhesion are cut into two one half inch wide strips using a straight edge and a sharp knife.
3. Cut a piece of an inflexible substrate (e.g. a glass-/epoxy prepreg) at least one inch wide and at least as long as the samples to be measured. Cover one surface of the inflexible substrate with double-sided tape.
4. Attach the film sample to the substrate by using a hand roller as follows:
a) For support film adhesion tests, remove the cover film (if present) and press the sample permanent coating side down, onto the taped substrate.
b) For cover film adhesion, remove the support film and press the sample coating side down, onto the taped substrate.
5. Fold a piece of one inch wide black tape in half so that it is at least as long as the sample itself, making sure that about an inch of the sticky side of the tape is left exposed at one end to form a "pulling strap".
6. Separate at least one inch of the film to be measured from the inflexible substrate/permanent coating combination and clamp the loosened end of the film to the lower clamp of an Instron.
7. Attach the one inch of the exposed inflexible substrate/permanent coating combination to the one inch exposed sticky portion of black tape and place the "pulling strap" in the upper Instron clamp.
8. Run the precalibrated Instron machine and record the average peel strength.

Temporary support film adhesion to the first photoimagable coating layer in the range of about 1 to 25 grams per linear inch is acceptable. Adhesion in the range of 3 to 10 grams per linear inch is preferred.

Cover film adhesion in the range of about 10 to 1000 grams per linear inch is acceptable. Adhesion in the range of 20 to 300 grams per linear inch is preferred.

Lamination Quality Tests

The Lamination Quality Tests given below are all performed using the lamination process described, supra, wherein a substantially photosensitive lamination liquid is applied to the surface of a printed circuit substrate and the permanent coating element is laminated to the wetted substrate. Visual examination is performed with the naked eye or up to 10x magnification.

1. A visual examination for lifting of the permanent coating from the printed circuit substrate or for the presence of entrapped air between the permanent coating and the substrate is performed after the process step of laminating the permanent coating dry film to the liquid wetted printed circuit substrate by passing this combination through a nip of heated, pressurized, rubber rolls and before trimming the excess permanent coating film. The requirement to pass is no visible lifting or entrapped air.
2. A visual examination for lifting of the permanent coating from the printed circuit substrate after trimming the excess permanent coating film from the substrate and before any rinsing of excess lamination liquid. The requirement to pass is no visible lifting of the permanent coating.
3. A visual examination for lifting of the permanent coating from the printed circuit substrate after rinsing the excess lamination liquid from the printed circuit substrate and laminated permanent coating and then drying the substrate/coating combination. The requirement to pass is no visible lifting of the permanent coating.
4. If the sample passes Lamination Quality Test 3, supra, the cover film is removed from the sample and the laminated permanent coating is visually examined for lifting from the substrate. The requirement to pass is no visible lifting of the permanent coating.

EXAMPLES

To further substantiate the invention, the examples below are provided. All component figures are given on a weight percent of total composition basis. Materials used for the examples are:

| Binders and Cobinders | |
|---|---|
| Elvacite ® 2627 | Methyl methacrylate/ethyl acrylate/methacrylic acid (51/29/20) copolymer from DuPont, Wilmington, DE with acid number = 130, $M_w$ = 45,000 and Tg = 80° C. |
| Elvacite ® 2628 | Ethylacrylate/ethylmethacrylate/methacrylic acid (48/40/12) copolymer from Du Pont, with acid number = 80, $M_w$ = 160,000 and Tg = 35° C. |
| RCP-15363 | Butyl acrylate/methyl methacrylate/hydroxyethyl methacrylate/methacrylic acid/styrene/macromer (38.9/15.3/15.3/0.25/0.25/30.0) copolymer from Du Pont, macromer is butyl methacrylate/hydroxyethyl methacrylate/methacrylic acid/methyl methacrylate (43/30/25/2). |
| Amphomer ® | Methyl methacrylate/t-octylacrylamide/acrylic acid/hydroxypropyl methacrylate/t-butylamino methacrylate (35/40/16/5/4 wt. %) from National Starch, Bridgewater, N.J. |
| Monomers | |
| TMPTA | Trimethylolpropane triacrylate |
| PETA | Pentaerythritol triacrylate |
| TRPGDA | Tripropyleneglycol diacrylate |
| Ebecryl ® 3704 | Diacrylate of bisphenol-A diglycidyl ether from Radcure, Atlanta, GA |
| TDMA | Triethylene glycol dimethacrylate |
| Photomer ® 4039 | Ethoxylated phenol monoacrylate from Henkel Corp., Ambler, PA |
| Photomer ® 4025 | Ethoxylated bisphenol A diacrylate from Henkel |
| Photomer ® 4770 | Polyamine acrylate from Henkel |
| Initiators | |
| Irgacure ® 369 | 2-Benzyl-2-N,N-dimethyl amino-1-(4-morpholino phenyl)-1-butanone from Ciba Geigy |
| EMK | Ethyl Michler's ketone |
| Thermal Crosslinking Agents | |
| Cymel ® 303 | Hexamethoxymethyl-melamine from American Cyanamide, Wayne, NJ |
| Desmodur ® BL315A | Blocked isocyanate from Mobay Corporation, Pittsburg, PA |
| Fillers | |
| Cyprubond ® | 1% aminosilane treated silicate from Cyprus Minerals, |

-continued

| | Englewood, CO |
|---|---|
| Adhesion Promotors | |
| 3 MT | 3-Mercapto-1H-1,2,4-triazole |
| Other ingredients | |
| Hycar 1472 × 26 | Methylacrylic acid/butadiene/acrylonitrile (5/70/25) copolymer from Zeon-Nippon, Cleveland, OH |
| DEHA | Diethylhydroxylamine |
| Dayglo ® 122-9655 | Green and yellow dye in a carrier from Dayglo Corp., Cleveland, OH |
| Value Green 122-9693 | Green dye in a carrier from Dayglo |
| Penncolor 9G5 | Green pigment in TMPTA from Penncolor |
| PVP-K-90 | Polyvinylpyrrolidone from GAF Chemicals Corp., Texas City, TX |
| Santicizer ® 160 | Butyl benzylphthalate from Monsanto Co. |

Permanent Coating Formation

The ingredients given in the examples are mixed in solvent chosen to provide the proper solution rheology for the manufacturing method employed. The first permanent coating layer for all examples in which it was present was coated from Dowanol ® PM, from Dow Chemical, Midland, Mich., onto a polyethylene terephthalate support film and air dried at ambient or elevated temperature. Example 5 utilized a silicone treatment on the coated side. For Examples 1-3, 5 and 6, the coating solvent for the second permanent coating layer was a methanol/acetone mixture and for Example 4 a methylene chloride/methanol mixture was utilized. The second layer was then coated on top of the first layer, air dried at ambient or elevated temperature and then covered with a matte poly cover sheet as indicated in the examples.

The lamination process used in the examples to laminated the permanent coatings to circuit borads consisted of:

(1) applying to a substrate surface a liquid which is substantially photosensitive to actinic radiation,
(2) removing the support film from the permanent coating element,
(3) laminating the permanent coating dry film to the liquid wetted substrate by passing this combination through a nip of heated, pressurized, rubber rolls,
(4) trimming the excess permanent coating film, and,
(5) rinsing the excess lamination liquid from the substrate and drying the substrate. The permanent coating dry film, in combination with the lamination liquid, must adhere to the substrate such that it is functional throughout the lamination process as well as for subsequent process steps and in the intended enduse.

The lamination liquid formulations used in the Examples are:

| Lamination Liquid 1 | |
|---|---|
| TRPGDA | |
| Lamination Liquid 2 | |
| Photomer ® 4039 | 29.06 |
| Photomer ® 4770 | 10.00 |
| Photomer ® 4025 | 10.00 |
| TDMA | 43.75 |
| Irgacure ® 369 | 2.00 |
| Santicizer ® 160 | 5.00 |
| 3-MT | 0.20 |

Processing conditions for the permanent coatings once laminated to circuit boards are as follows:

Exposure of all examples was between 100 and 300 mj/cm$^2$. Development conditions were 105° F. and 20 to 50 seconds in aqueous 0.85% sodium carbonate at 20 to 30 psi spray pressure. The cure for all examples was exposure to uv radiation of 2 to 8 joules followed by a thermal cure of 150° C. for one hour, or in the reverse sequence.

TABLE 1

| | EXAMPLES | | | | | | | |
|---|---|---|---|---|---|---|---|---|
| | 1 | | 2 | | 3 | | 4 | |
| LAYER | First | Secnd. | First | Secnd. | First | Secnd. | First | Secnd. |
| INGREDIENTS | | | | | | | | |
| Elvacite ® 2627 | 71.7 | | 71.7 | | 71.7 | | 80.6 | |
| Elvacite ® 2628 | | | | | | | | 43.5 |
| RCP-15363 | | 34.33 | | 35.05 | | 35.05 | | |
| Cyprubond | | 13.00 | | 13.22 | | 13.22 | | |
| Amphomer | 17.8 | 2.39 | 17.8 | 2.36 | 17.8 | 2.36 | 8.9 | 2.0 |
| TMPTA | 8.9 | 12.76 | 8.9 | 12.70 | 8.9 | 12.70 | 8.9 | 8.0 |
| PETA | | 16.21 | | 16.14 | | 16.14 | | 8.0 |
| Ebecyrl ® 3704 | | | | | | | | 14.0 |
| Irgacure ® 369 | 2.6 | | 2.6 | | 2.6 | | 2.6 | |
| Benzophenone | | 3.02 | | 3.00 | | 3.00 | | 4.0 |
| EMK | | 0.26 | | 0.26 | | 0.26 | | 0.18 |
| Cymel ® 303 | | | | | | | | 12.5 |
| Desmodur ® BL315A | | 8.08 | | 8.04 | | 8.04 | | |
| 3 MT | | 0.17 | | 0.17 | | 0.17 | | 0.2 |
| Hycar ® 1472 × 26 | | | | | | | | 1.50 |
| DEHA | | 0.04 | | 0.04 | | 0.04 | | 0.05 |
| Dayglo ® 122-9655 | | 1.30 | | 1.29 | | 1.29 | | 0.5 |
| Value Green 122-9693 | | | | | | | | 3.0 |
| Pencolor 95G | | 4.32 | | 4.29 | | 4.29 | | |
| PVP K-90 | | 4.14 | | 3.43 | | 3.43 | | 2.6 |
| Micron Thickness | 2 | 25 | 5 | 25 | 5 | 25 | 2 | 25 |
| Cover Sheet | Polyethylene | | Polyethylene | | Polypropylene | | Polyethylene | |
| Lamination Liquid | 1 | | 1 | | 1 | | 1 | |

TABLE 2

| | EXAMPLES | | | |
|---|---|---|---|---|
| TEST | 1 | 2 | 3 | 4 |
| Adhesion | | | | |

TABLE 2-continued

| TEST | EXAMPLES | | | |
|---|---|---|---|---|
| | 1 | 2 | 3 | 4 |
| (gr./linear in.) | | | | |
| Support film | 16 | 5 | 4 | 5 |
| Cover film | 15 | 17 | 122 | 99 |
| Lamination Quality | | | | |
| Test 1 | Fail | Pass | Pass | Pass |
| Test 2 | Fail | Pass | Pass | Pass |
| Test 3 | Fail | Pass | Pass | Pass |
| Test 4 | | Pass | Pass | Pass |

TABLE 3

| | EXAMPLES | | | |
|---|---|---|---|---|
| | 5 | | 6 | |
| LAYER | First | Secnd. | First | Secnd. |
| INGREDIENTS | | | | |
| Elvacite ® 2627 | | | 71.7 | |
| RCP-15363 | | 34.24 | | 34.24 |
| Cyprubond ® | | 12.94 | | 12.94 |
| Amphomer | | 2.38 | 17.8 | 2.38 |
| TMPTA | | 12.78 | 8.9 | 12.78 |
| PETA | | 16.19 | | 16.19 |
| Irgacure ® 369 | | | 2.6 | |
| Benzophenone | | 3.01 | | 3.01 |
| EMK | | 0.26 | | 0.26 |
| Desmodur ® BL315A | | 8.08 | | 8.08 |
| 3 MT | | 0.17 | | 0.17 |
| Dayglo ® 122-9655 | | 1.29 | | 1.29 |
| Pencolor 95G | | 4.30 | | 4.30 |
| PVP K-90 | | 4.31 | | 4.31 |
| Micron Thickness | | 25 | 6 | 25 |
| Cover Sheet | | Polyethylene | | Polyethylene |
| Lamination Liquid | | 2 | | 2 |
| Lamination Quality | | | | |
| Test 1 | | Fail | | Pass |
| Test 2 | | Fail | | Pass |
| Test 3 | | Fail | | Pass |
| Test 4 | | Fail | | Pass |

What is claimed is:

1. An aqueous processble, storage stable, photoimageable permanent coating element capable of adhering to a circuit board and withstanding molten solder after cure, which comprises:
   (a) a temporary support film;
   (b) a first layer of a photoimagable permanent coating composition comprising:
   (I) an amphoteric binder;
   (II) a carboxyl containing copolymeric binder;
   (III) a monomeric component containing at least two ethylenically unsaturated groups; and
   (IV) a photoinitiator or photoinitiator system;
   (c) a second layer of a photoimagable permanent coating composition comprising;
   (I) a carboxyl containing copolymeric binder;
   (II) a monomeric component containing at least two ethylenically unsaturated groups;
   (III) a photoinitiator or photoinitiator system; and
   (IV) a thermal crosslinking agent,
   wherein the first layer is interposed between the support and the second layer.

2. The permanent coating element of claim 1 which further comprises on the second photoimagable coating layer (c) a cover film.

3. The permanent coating element of claim 2 wherein the adhesion of said first photoimagable layer (b) to said second photoimagable layer (c) is greater than the adhesion between said first photoimagable layer (b) and said support film (a); the adhesion of said first photoimagable layer (b) to said second photoimagable layer (c) is greater than the adhesion between said second photoimagable layer (c) and said cover film; and the adhesion between said second photoimagable layer (c) and said cover film is greater than the adhesion between said first photoimagable layer (b) and said support film (a).

4. The permanent coating element of claim 1 wherein the carboxyl containing copolymer binder consists essentially of units having the structure:

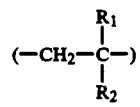

in which:
   $R_1$ is H or alkyl;
   $R_2$ is phenyl, $CO_2R_3$ or macromer; and
   $R_3$ is H or alkyl which is unsubstituted or substituted with one or more hydroxy groups,
   wherein the level of carboxyl groups is determined for a given composition by optimizing the amount needed for good development in aqueous alkaline developer.

5. The permanent coating element of claim 1 in which said first layer further comprises a thermal crosslinking agent.

6. The permanent coating element of claim 5 wherein the thermal crosslinking agent is selected from the group consisting of an adduct of a polyisocyanate and an isocyanate-group blocking agent, a formaldehyde condensation product with melamine and a formaldehyde condensation product with urea.

7. The permanent coating element of claim 1 wherein the thermal crosslinking agent is selected from the group consisting of an adduct of a polyisocyanate and an isocyanate-group blocking agent, a formaldehyde condensation product with melamine and a formaldehyde condensation product with urea.

8. The permanent coating element of claim 4 wherein 5 to 50 parts by weight of monomer comprising said copolymer binder is macromer.

9. The permanent coating element of claim 8 wherein the macromer has a weight average molecular weight of about 5,000 or less and a polydispersity of about 3 or less.

10. The permanent coating element of claim 9 wherein the macromer is formed from at least one or more monomer components selected from the group consisting of methyl methacrylate, ethyl acrylate, ethyl methacrylate, butyl acrylate, butyl methacrylate, 2-hydroxyethyl acrylate, 2-hydroxyethyl methacrylate, methacrylic acid, acrylic acid and styrene.

11. The permanent coating element of claim 1 wherein the amphoteric binder comprises an, interpolymer of:
   (a) 30–60 percent by weight of a comonomer selected from the group consisting of $C_{2-12}$ N-alkyl (meth)acrylamide, $C_{1-4}$ alkyl ($C_{2-4}$) aminoalkyl (meth)acrylates, and mixtures thereof;
   (b) 10–25 percent by weight of an acidic comonomer selected from the group consisting of (meth)acrylic, crotonic, itaconic, maleic and fumaric acids and $C_{1-4}$ alkyl half esters of maleic and fumaric acid, and mixtures thereof; and
   (c) 20–55 percent by weight of a copolymerizable comonomer selected from the group consisting of $C_{1-12}$ alkyl (meth)acrylates, $C_{2-4}$ hydroxyalkyl (meth)acrylates, hydroxystearyl (meth)acrylates, and mixtures thereof.

12. The permanent coating element of claim 1 wherein said monomeric component is selected from the group consisting of hexamethylene glycol diacrylate, triethylene glycol diacrylate, tripropylene glycol diacrylate, pentaerythritol triacrylate, trimethylolpropane triacrylate, polyoxyethylated trimethylolpropane triacrylate, pentaerythritol triacrylate, pentaerythritol tetracrylate, bisphenol A diacrylate, di-(3-acryloxy-2-hydroxypropyl) ether of bisphenol-A, di-(3-acryloxy-2-hydroxypropyl) ether of tetrabromo-bisphenol-A, aliphatic urethane diacrylate and aromatic urethane diacrylate.

13. The permanent coating element of claim 1 wherein the first or second layer further comprises an inorganic filler.

14. The permanent coating element of claim 13 wherein the inorganic filler is aminosilane treated talc.

15. A process for laminating an aqueous processable, storage stable, photoimageable permanent coating element having a temporary support, first and second photoimagable layers and a cover film wherein the photoimagable layers are interposed between the support and cover films, to a printed circuit substrate which comprises the steps of:
   (a) applying to a surface of the substrate a liquid which is capable of migrating into the permanent coating and becoming part of the cured permanent coating;
   (b) removing the support film from the permanent coating element;
   (c) laminating the substrate and preformed nonliquid permanent coating element whereby excess liquid is forced along at least one edge of the laminated substrate and permanent coating element, whereby adherence is obtained of the substrate to the permanent coating through the laminating liquid penetrated permanent coating interface with the substrate surface and whereby any raised relief on the substrate is encapsulated with the permanent coating; and
   (d) trimming the excess permanent coating element from the substrate,
   wherein the first layer of the photoimagable permanent coating composition comprises:
   (I) an amphoteric binder;
   (II) a carboxyl containing copolymeric binder;
   (III) a monomeric component containing at least two ethylenically unsaturated groups; and
   (IV) a photoinitiator or photoinitiator system, and the second layer of the photoimagable permanent coating composition comprises:
   (I) a carboxyl containing copolymeric binder;
   (II) a monomeric component containing at least two ethylenically unsaturated groups;
   (III) a photoinitiator or photoinitiator system; and
   (IV) a thermal crosslinking agent.

16. The laminating process of claim 15 wherein the carboxyl containing copolymer binder is comprised of units having the structure:

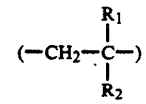

in which:
   $R_1$ is H or alkyl;
   $R_2$ is phenyl, $CO_2R_3$ or macromer; and
   $R_3$ is H or alkyl which is unsubstituted or substituted with one or more hydroxy groups,
   wherein the level of carboxyl groups is determined for a given composition by optimizing the amount needed for good development in aqueous alkaline developer.

* * * * *